United States Patent
Yao

(10) Patent No.: US 9,337,407 B2
(45) Date of Patent: May 10, 2016

(54) PHOTOELECTRONIC ELEMENT AND THE MANUFACTURING METHOD THEREOF

(75) Inventor: Chiu-Lin Yao, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 555 days.

(21) Appl. No.: 12/751,642

(22) Filed: Mar. 31, 2010

(65) Prior Publication Data

US 2010/0244077 A1    Sep. 30, 2010

(30) Foreign Application Priority Data

Mar. 31, 2009 (TW) ............................... 98110800 A
Apr. 10, 2009 (CN) ........................... 2009 1 0134306

(51) Int. Cl.

| H01L 33/00 | (2010.01) |
| H01L 33/64 | (2010.01) |
| H01L 33/14 | (2010.01) |
| H01L 33/22 | (2010.01) |
| H01L 33/38 | (2010.01) |
| H01L 33/44 | (2010.01) |
| H01L 33/46 | (2010.01) |

(52) U.S. Cl.
CPC .......... *H01L 33/641* (2013.01); *H01L 33/0079* (2013.01); *H01L 33/145* (2013.01); *H01L 33/22* (2013.01); *H01L 33/38* (2013.01); *H01L 33/44* (2013.01); *H01L 33/46* (2013.01); *H01L 33/642* (2013.01); *H01L 2924/0002* (2013.01)

(58) Field of Classification Search
CPC ....... H01L 33/405; H01L 33/60; H01L 33/44; H01L 33/08; H01L 33/10; H01L 33/20; H01L 33/505; H01L 33/00; H01L 33/02; H01L 33/38; H01L 33/52; H01L 33/58; H01L 33/64; H01L 33/48

USPC .............. 257/98, 79, 86, 93, 94, 95, 99, 100, 257/103, E33.002, E33.067, E33.068, 257/E33.07, E33.072, E33.055, E33.005, 257/E33.006, 76

See application file for complete search history.

(56) References Cited

U.S. PATENT DOCUMENTS

| 7,335,924 B2 | 2/2008 | Liu et al. |
| 7,858,999 B2 * | 12/2010 | Horng et al. .................... 257/98 |
| 2002/0195609 A1* | 12/2002 | Yoshitake et al. .............. 257/81 |

(Continued)

FOREIGN PATENT DOCUMENTS

| CN | 1592513 A | 3/2005 |
| CN | 1897316 A | 1/2007 |

(Continued)

*Primary Examiner* — Daniel Whalen
*Assistant Examiner* — Suberr Chi
(74) *Attorney, Agent, or Firm* — Muncy, Geissler, Olds & Lowe, P.C.

(57) ABSTRACT

A photoelectronic element includes an electrically insulative substrate, an electrically conductive substrate, an intermediate layer and a semiconductor stacked layer. The electrically insulative substrate has a top surface. The electrically conductive substrate has a lower portion, and an upper portion surrounded by the electrically insulative substrate and coplanar with the top surface. The intermediate layer has a first portion formed directly under the electrically insulative substrate and above the electrically conductive substrate, a second portion and a bent portion formed between the first portion and the second portion. The semiconductor stacked layer has an light-emitting active layer with a high band gap, disposed on the electrically insulative substrate and the upper portion.

9 Claims, 8 Drawing Sheets

(56) References Cited

U.S. PATENT DOCUMENTS

| | | | |
|---|---|---|---|
| 2004/0075102 A1* | 4/2004 | Chen et al. ................... 257/103 |
| 2004/0211972 A1* | 10/2004 | Du et al. ........................ 257/99 |
| 2007/0272937 A1* | 11/2007 | Sakamoto et al. .............. 257/98 |
| 2008/0048202 A1* | 2/2008 | Tazima et al. ................... 257/98 |
| 2008/0090356 A1* | 4/2008 | Park .................. H01L 29/66553 |
| | | | 438/270 |
| 2008/0308832 A1 | 12/2008 | Hsieh et al. |
| 2009/0026490 A1* | 1/2009 | Kim et al. ..................... 257/103 |
| 2009/0045425 A1* | 2/2009 | Yasuda et al. ........... H01L 33/00 |
| 2009/0134381 A1* | 5/2009 | Shimamune ...... H01L 21/02381 |
| | | | 257/19 |
| 2009/0134416 A1* | 5/2009 | Lee ................................. 257/98 |
| 2009/0305447 A1* | 12/2009 | Guenter .......................... 438/39 |
| 2010/0038664 A1 | 2/2010 | Strauss |

FOREIGN PATENT DOCUMENTS

| | | |
|---|---|---|
| CN | 101939856 A | 1/2011 |
| TW | 200845430 A | 11/2008 |
| TW | 200910472 A | 3/2009 |

* cited by examiner

US 9,337,407 B2

PHOTOELECTRONIC ELEMENT AND THE MANUFACTURING METHOD THEREOF

TECHNICAL FIELD

The application relates to a photoelectronic element, and more particularly to a photoelectronic element with a composite substrate.

REFERENCE TO RELATED APPLICATION

The application claims the right of priority based on TW application Ser. No. 098110800 filed on Mar. 31, 2009, which is incorporated herein by reference and assigned to the assignee herein.

DESCRIPTION OF BACKGROUND ART

Photoelectronic element includes many types, such as Light-emitting Diode (LED), solar cell, and photo diode. Taking LED for example, LED is a solid state semiconductor element comprising a p-n junction formed between a p type semiconductor layer and an n type semiconductor layer. When imposing a certain level of forward voltage to the p-n junction, holes from the p type semiconductor layer and electrons from the n type semiconductor layer are combined to release light. The region of releasing the light is generally called light-emitting region.

The features of LED mainly include small size, high efficiency, long life, quick reaction, high reliability, and fine color. So far, LED has been applied to electronic devices, vehicles, signboards, and traffic signs. Along with the launch of the full-color LED, LED has gradually replaced traditional lighting apparatus such as fluorescent lights and incandescent lamps.

Each of the foregoing photoelectronic elements can further connect a substrate thereof to a base via solders or adhesive elements. Moreover, the base includes at least a circuit to electrically connect with a contact of a light-emitting device or a light-absorbing device via a conductive structure such as wire lines.

SUMMARY OF THE DISCLOSURE

In accordance with a first embodiment of present application, a photoelectronic element includes: a composite substrate including an electrically insulative substrate having a chamber, an intermediate layer, and an electrically conductive substrate; a bonding layer including an electrically conductive region and an electrically insulative region; a first current spreading layer; a first semiconductor stacked layer including a first semiconductor layer, a first active layer, and a second semiconductor layer; a current blocking layer; a second current spreading layer; and a first electrode.

In accordance with a second embodiment of present application, the photoelectronic element further includes a window layer.

In accordance with a third embodiment of present application, the current blocking layer of the photoelectronic element is disposed between the first current spreading layer and the window layer.

In accordance with a fourth embodiment of present application, the first active layer of the photoelectronic element includes a high band-gap region.

In accordance with a fifth embodiment of present application, the photoelectronic element further includes a second reflective layer, a second semiconductor stacked layer, and a third current spreading layer.

In accordance with a sixth embodiment of present application, the photoelectronic element further includes a second electrode.

In accordance with a seventh embodiment of present application, the current blocking layer of the photoelectronic element is disposed between the first current spreading layer and the window layer.

In accordance with an eighth embodiment of present application, the first active layer of the photoelectronic element further includes a high band gap region.

DETAILED DESCRIPTION OF PREFERRED EMBODIMENTS

The embodiments of present application will be described in detail and sketched in figures.

Figure 1A:
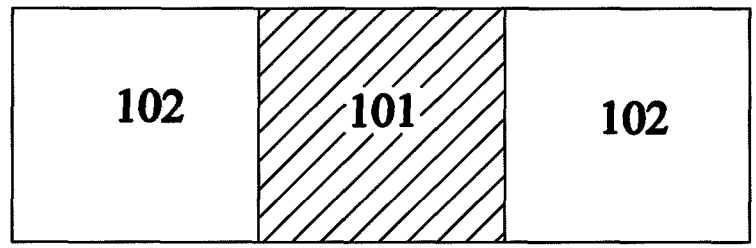
FIGS. 1A-1G illustrate cross-sectional views of the manufacturing process in accordance with a first embodiment of present application.
Figure 1B:
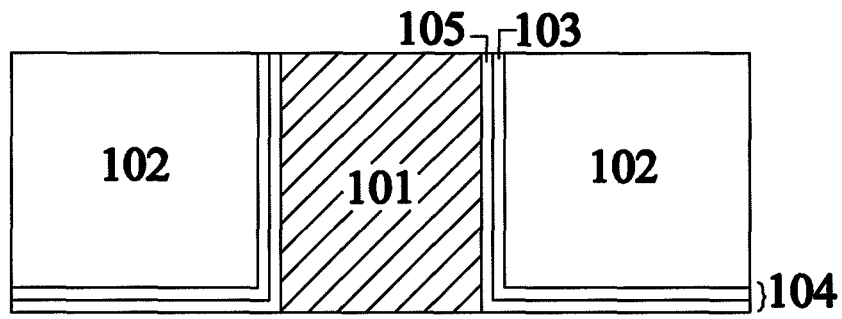
Figure 1C:
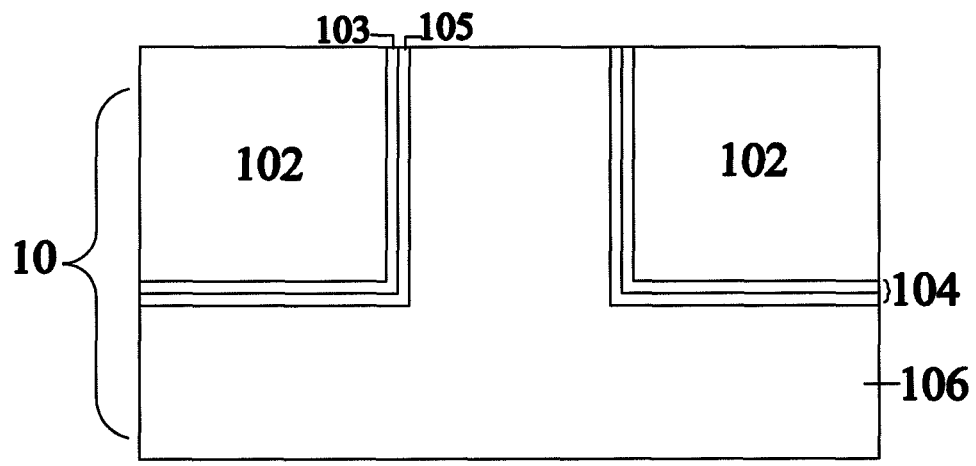
Figure 1D:
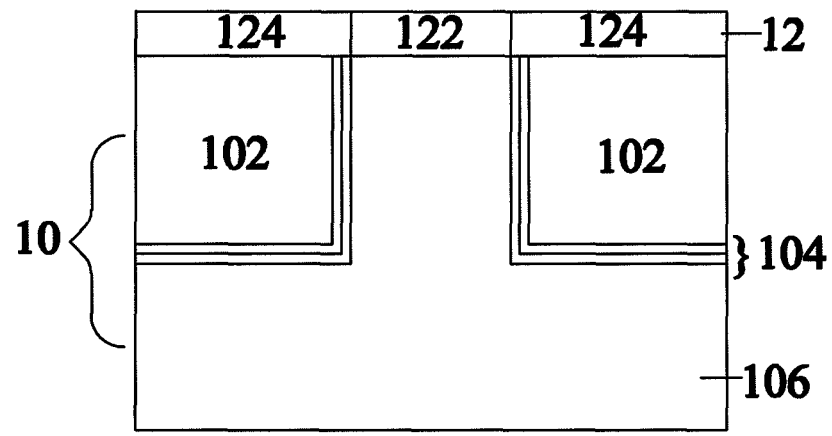
Figure 1E:
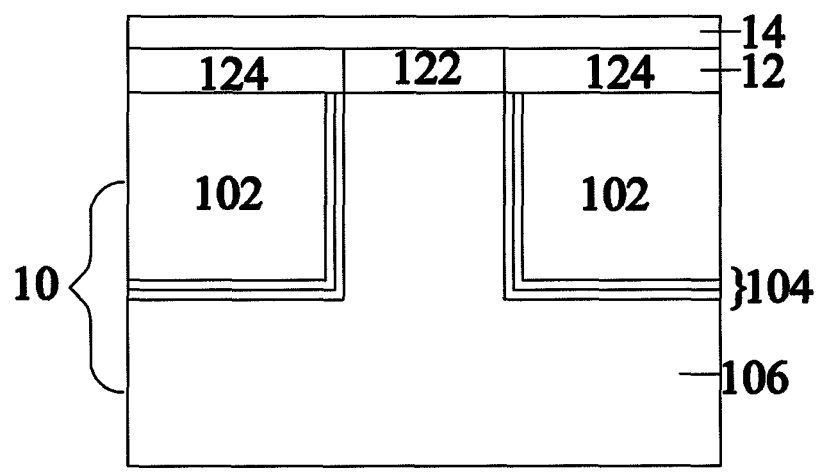
Figure 1F:
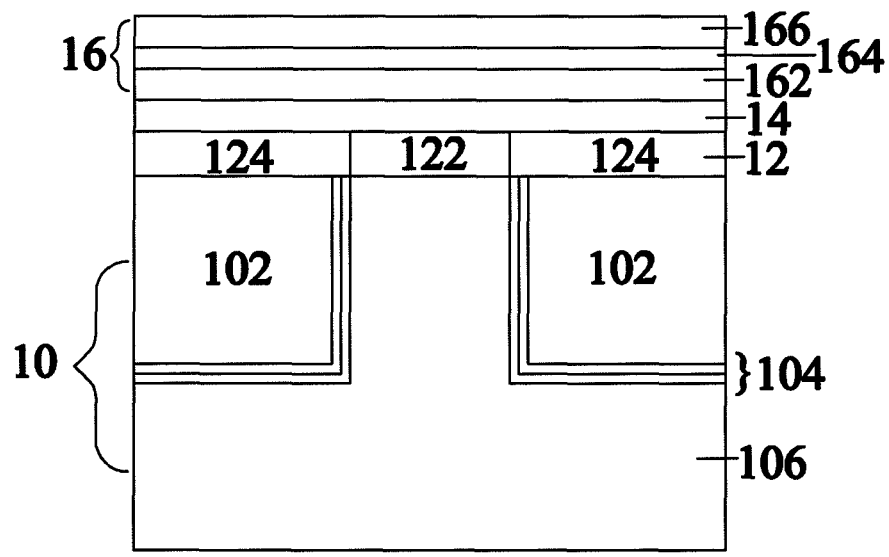
Figure 1G:
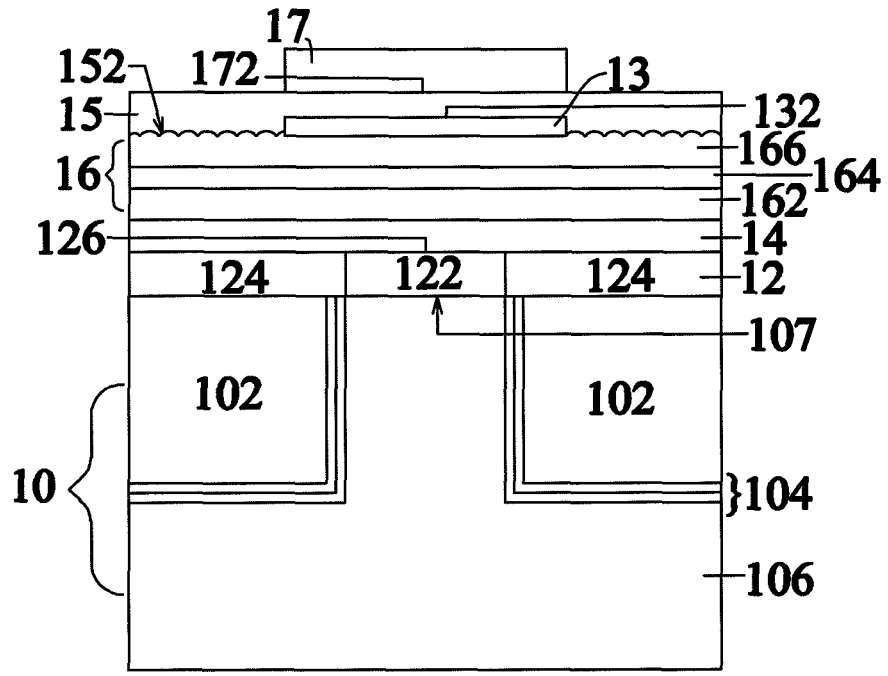

FIGS. 1A-1G illustrate cross-sectional views of the manufacturing process in accordance with a first embodiment, wherein FIGS. 1A-1C are cross-sectional figures of manufacturing a composite substrate of a photoelectronic element shown in FIG. 1G. As shown in FIG. 1C, a composite substrate 10 includes an electrically insulative substrate 102, an electrically conductive substrate 106, and an intermediate layer 104 disposed between the electrically insulative substrate 102 and the electrically conductive substrate 106. As shown in FIG. 1A, the electrically insulative substrate 102 having a chamber 101 formed therein is provided. The chamber 101 is a space formed by removing a part of the electrically insulative substrate 102 and then is surrounded by the exposed inside walls thereof. The method for forming the chamber 101 includes etching or laser ablation. As shown in FIG. 1B, an intermediate layer 104 is formed under the electrically insulative substrate 102 and between the chamber 101 and the electrically insulative substrate 102. The intermediate layer 104 includes an absorbing layer 105 disposed under the electrically insulative substrate 102 and between the chamber 101 and the electrically insulative substrate 102, and a first reflective layer 103 disposed between the electrically insulative substrate 102 and the absorbing layer 105. Referring to FIG. 1C, the electrically conductive substrate 106 is formed under the intermediate layer 104 to form the composite substrate 10. Referring to FIGS. 1D-1E, a bonding layer 12 is disposed on the composite substrate 10 and includes an electrically conductive region 122 disposed on the electrically conductive substrate 106 to be electrically in contact with the electrically conductive substrate 106 and an electrically insulative region 124 disposed on the electrically insulative substrate 102, wherein the electrically insulative region 124 surrounds and is adjacent to the electrically conductive region 122, and directly contacts to the electrically insulative substrate 102. The term "adjacent to" means that the electrically insulative region 124 directly contacts to the sidewalls of the electrically conductive region 122. A first current spreading layer 14 is disposed on the bonding layer 12. As shown in FIGS. 1F-1G, a first semiconductor stacked layer 16 is formed on the first current spreading layer 14, wherein the first semiconductor stacked layer 16 includes a first semiconductor layer 162 disposed on the first current spreading layer 14; a first active layer 164 disposed on the first semiconductor layer 162; and a second semiconductor layer 166 disposed on the first active layer 164. A current blocking layer 13 is disposed on the first semiconductor stacked layer 16, wherein the current blocking layer 13 is disposed directly above the electrically conductive region 122; a second current spreading layer 15 is disposed on the first semiconductor stacked layer 16 and the current blocking layer 13, wherein the second current spreading layer 15 further covers the current blocking layer 13; and a first electrode 17 is disposed on the second current spreading layer 15 wherein the first electrode 17 is disposed directly above the electrically conductive region 122, and an area of the top surface 126 of the electrically conductive region 122 is preferred not being larger than the area of the bottom surface 172 of the first electrode 17.

The electrically insulative substrate 102 is for supporting the semiconductor structure thereon, and its material is electrically insulative with higher band gap such as Sapphire, Diamond, Glass, Quartz, Acryl, ZnO, or AlN. The first reflective layer 103 can be material with high reflective index, such as Cu, Al, In, Sn, Au, Pt, Zn, Ag, Ti, Pb, Pd, Ge, Ni, Cr, Cd, Mn, Sb, Bi, Ga, Tl, As, Se, Te, Po, Ir, Be, Mg, Ca, Sr, Ba, Zr, Mo, La, Cu—Sn, Cu—Zn, Cu—Cd, Sn—Pb—Sb, Sn—Pb—Zn, Ni—Sn, Ni—Co, or Au Alloy and so on, to reflect light from outside or the first active layer 164. The absorbing layer 105 is for promoting the adhesion and deposition of electroplating material and can be electrically conductive materials such as Cu, Al, In, Sn, Au, Pt, Zn, Ag, Ti, Pb, Pd, Ge, Ni, Cr, Cd, Co, Mn, Sb, Bi, Ga, Tl, As, Se, Te, Po, Ir, Re, Rh, Os, W, Li, Na, K, Be, Mg, Ca, Sr, Ba, Zr, Mo, La, Cu—Sn, Cu—Zn, Cu—Cd, Sn—Pb—Sb, Sn—Pb—Zn, Ni—Sn, Ni—Co, or Au alloy and so on. The electrically conductive substrate 106 can support the electrically insulative substrate 102 and the semiconductor structure thereon and can promote electrical or thermal conduction. The material thereof includes Cu, Al, In, Sn, Au, Pt, Zn, Ag, Ti, Pb, Pd, Ge, Ni, Cr, Cd, Co, Mn, Sb, Bi, Ga, Tl, As, Se, Te, Po, Ir, Re, Rh, Os, W, Li, Na, K, Be, Mg, Ca, Sr, Ba, Zr, Mo, La, Cu—Sn, Cu—Zn, Cu—Cd, Sn—Pb—Sb, Sn—Pb—Zn, Ni—Sn, Ni—Co, Au alloy, AuSn, InAg, InAu, AuBe, AuGe, AuZn, PbSn or PdIn. The method for forming the electrically conductive substrate 106 includes electroplating. Additionally, the composite substrate 10 further includes Cu, Al, metal, composite materials, Metal Matrix Composite (MMC), Ceramic Matrix Composite (CMC), Si, IP, ZnSe, AlN, GaAs, SiC, GaP, GaAsP, ZnSe, ZnO, InP, LiGaO$_2$, or LiAlO$_2$.

The electrically conductive region 122 can be material with electrical conductivity and adhesive characteristic such as In, Sn, Al, Au, Pt, Zn, Ag, Ti, Pb, Pd, Ge, Cu, Ni, AuSn, InAg, InAu, AuBe, AuGe, Zn, PbSn, or PdIn, for conducting current and attaching the composite substrate 10 to the semiconductor structure thereon. The material of the electrically insulative region 124 has higher band gap and is electrically insulative and adhesive, such as dielectric material, Su8, BCB, PFCB, Epoxy, Acrylic Resin, COC, PMMA, PET, PC, Polyetherimide, Fluorocarbon Polymer, Silicone, Glass, Al$_2$O$_3$, SiO$_2$, TiO$_2$, SiN$_x$, SOG, Tetraethyl Orthosilane (TEOS), or other organic adhesive materials for changing the current path of the photoelectronic element and attaching the composite substrate 10 to the semiconductor structure thereon. The materials of the first current spreading layer 14 and the second spreading layer 15 have low lateral resistance so as to spread the current more easily in lateral direction, wherein the materials thereof can be ITO, InO, SnO, CTO, ATO, AZO, ZTO, ZnO, AlGaAs, GaN, GaP, GaAs, GaAsP, In, Sn, Al, Au, Pt, Zn, Ag, Ti, Pb, Pd, Ge, Cu, Ni, InAg, InAu, AuBe, AuGe, AuZn, PbSn, PdIn, or AuSn, wherein the structure thereof includes a single layer or a stacked-layers structure. The first active layer 164 on the first semiconductor layer 162 can absorb or produce light. The polarity of the first semiconductor layer 162 is different from that of the second semiconductor layer 166. The material of the first semiconductor layer 162 and/or the second semiconductor layer 166 includes one or more than one elected from the group consisting of Ga, Al, In, As, P, N, Zn, Se, Sb, Cd, Te, Hg, S, H, Mg, Sn, B, Pb, C, and Si. The second semiconductor layer 166 can optionally have a rough upper surface disposed under the second current spreading layer 15. The current blocking layer 13 can be material with high resistance such as dielectric material, Su8, BCB, PFCB, Epoxy, Acrylic Resin, COC, PMMA, PET, PC, Polyetherimide, Fluorocarbon Polymer, Silicone, Glass, Al$_2$O$_3$, SiO$_2$, TiO$_2$, SiNX, SOG, Tetraethyl Orthosilane (TEOS), or other organic adhesive materials for changing current path of the photoelectronic element. The first electrode 17 can be metal, such as Cu, Al, In, Sn, Au, Pt, Zn, Ag, Ti, Pb, Pd, Ge, Ni, Cr, Cd, Co, Mn, Sb, Bi, Ga, Tl, As, Se, Te, Po, Ir, Re, Rh, Os, W, Li, Na, K, Be, Mg, Ca, Sr, Ba, Zr, Mo, La, Cu—Sn, Cu—Zn, Cu—Cd, Sn—Pb—Sb, Sn—Pb—Zn, Ni—Sn, Ni—Co, or Au alloy, and so on for receiving outer voltage.

As shown in FIG. 1G, the first electrode 17 and the current blocking layer 13 are both disposed on the electrically conductive region 122, and preferably directly above the electrically conductive region 122, wherein the area of the top surface 132 of the current blocking layer 13 is preferably not smaller than that of the bottom surface 172 of the first electrode 17 or the top surface 126 of the electrically conductive region 122. The electrically conductive substrate 106 includes a contact surface 107 directly in contact with the electrically conductive region 122, wherein the patterned structure of the contact surface 107, the current blocking layer 13, the electrically conductive region 122, and the first electrode 17 can have the same or different patterns. The electrically conductive region 122 can be a single electrically conductive region, such as a single region formed by electrically conductive material in the bonding layer 12, wherein the region is below or directly under the first electrode 17 and is directly in contact with the contact surface 107.

The electrically conductive substrate 106 is a material with high thermal conductivity so as to increase the thermal conduction rate of the photoelectronic element, therefore promoting the reliability and the light-emitting efficiency of the photoelectronic element. Besides, by electrically connecting the electrically conductive region 122 to the electrically conductive substrate 106, the current of the photoelectronic element can spread vertically; combining with the electrically insulative region 124 with high band gap and the electrically insulative substrate 102, the light absorption by the electrically conductive substrate 106 is avoided. The current blocking layer 13 is below or directly under the first electrode 17, so the current flows to regions not covered by the current blocking layer 13 to avoid the region of the first semiconductor stacked layer 16 under the first electrode 17 producing light. The light-absorbing probability of the first electrode 17 is therefore decreased.

Figure 2A:
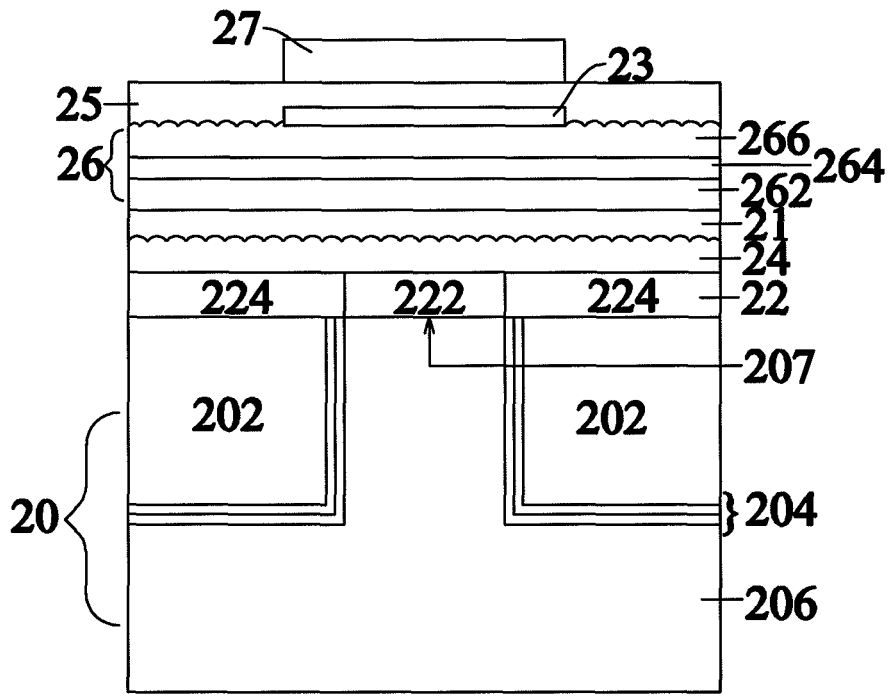
FIG. 2A illustrates a cross-sectional view of the photoelectronic element in accordance with a second embodiment of present application.
Figure 2B:
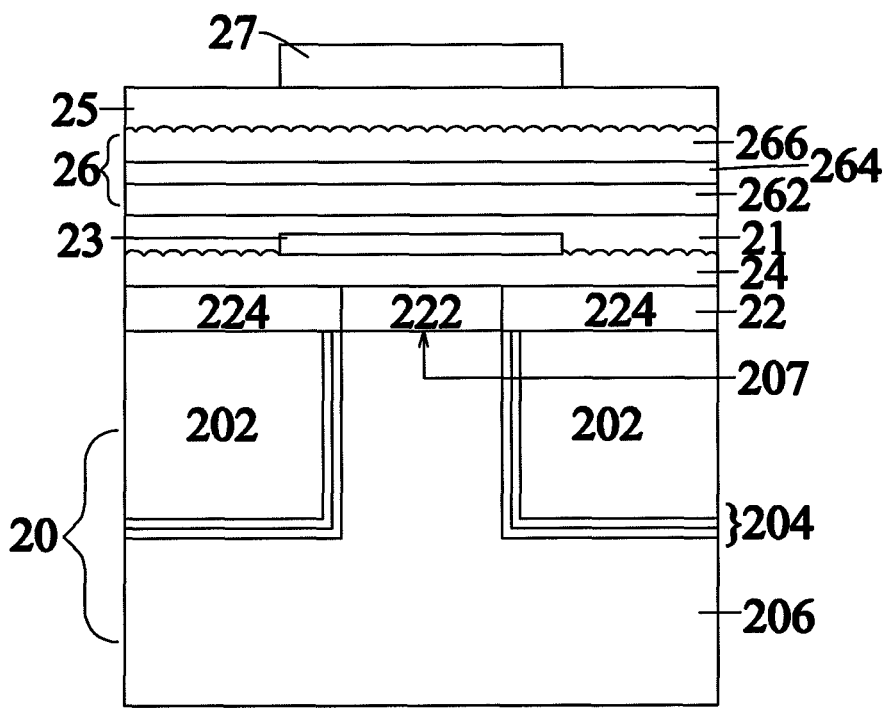
FIG. 2B illustrates a cross-sectional view of the photoelectronic element in accordance with a third embodiment of present application.

FIG. 2A illustrates a cross-sectional view in accordance with a second embodiment. The second embodiment is similar to the first embodiment and includes a composite substrate 20 including an electrically insulative substrate 202, an intermediate layer 204 and an electrically conductive substrate 206; a bonding layer 22 including an electrically conductive region 222 and an electrically insulative region 224; a first current spreading layer 24; a first semiconductor stacked layer 26 including a first semiconductor layer 262, a first active layer 264, and a second semiconductor layer 266; a current blocking layer 23; a second current spreading layer 25; and a first electrode 27. The difference between the second embodiment and the first embodiment is that the second embodiment further includes a window layer 21 disposed between the first semiconductor stacked layer 26 and the first current spreading layer 24. The refractive index of the window layer 21 is different from that of the first semiconductor stacked layer 26 so as to cause light to be scattered, therefore raising light-emitting efficiency of the photoelectronic element. The material of the window layer 21 can be ITO, NO, SnO, CTO, ATO, AZO, ZTO, ZnO, AlGaAs, GaN, GaP, GaAs, or GaAsP. Besides, the window layer 21 can optionally have a rough bottom surface on the interface between the window layer 21 and the first current spreading layer 24. FIG. 2B illustrates a cross-sectional view in accordance with a third embodiment, the third embodiment is similar to the second embodiment, and the difference therebetween is that the current blocking layer 23 is disposed between the first current spreading layer 24 and the window layer 21, wherein the blocking layer 23 is further covered by the window layer 21. The electrically conductive substrate 206 includes a contact surface 207, wherein the patterned structure of the contact surface 207, the current blocking layer 23, the electrically conductive region 222, and the first electrode 27 can have the same or different patterns.

Figure 3:
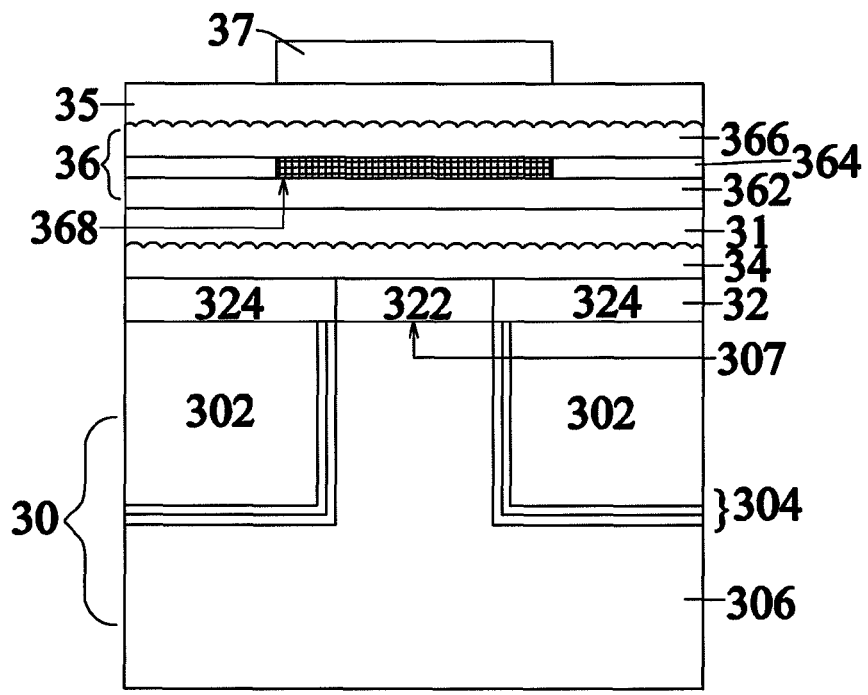
FIG. 3 illustrates a cross-sectional view of the photoelectronic element in accordance with a fourth embodiment of present application.

As shown in FIG. 3, a fourth embodiment is similar to the second embodiment and includes a composite substrate 30 including an electrically insulative substrate 302, an intermediate layer 304, and an electrically conductive substrate 306; a bonding layer 32 including an electrically conductive region 322 and an electrically insulative region 324; a first current spreading layer 34; a window layer 31; a first semiconductor stacked layer 36 including a first semiconductor layer 362, a first active layer 364, and a second semiconductor layer 366; a second current spreading layer 35; and a first electrode 37. The difference between the fourth embodiment and the second embodiment is that there is no current blocking layer in the fourth embodiment, and the first active layer 364 includes a high band gap region 368 being a high resistance region for changing circuit path within the photoelectronic element. The high band gap region 368 is below or directly under the first electrode 37 to make the current flows to the regions other than the high band gap region 368, so no light is produced in the high band gap region 368, and the probability of the light-absorbing of the first electrode 37 can be reduced. The electrically conductive substrate 306 includes a contact surface 307 directly in contact with the electrically conductive region 322, wherein the patterned structure of the contact surface 307, the electrically conductive region 322, the high band gap region 368, and the first electrode 37 can have the same or different patterns.

The method for forming the high band gap region 368 includes heating a specific region in the first active layer 364 via laser to change the composition thereof, therefore the high band gap region 368 can be formed, or using laser to heat the second semiconductor layer 366, so that the heat is conducted to the specific region of the first active layer 364 to change the composition thereof. The high band gap region 368 is below or directly under the first electrode 37.

Figure 4:
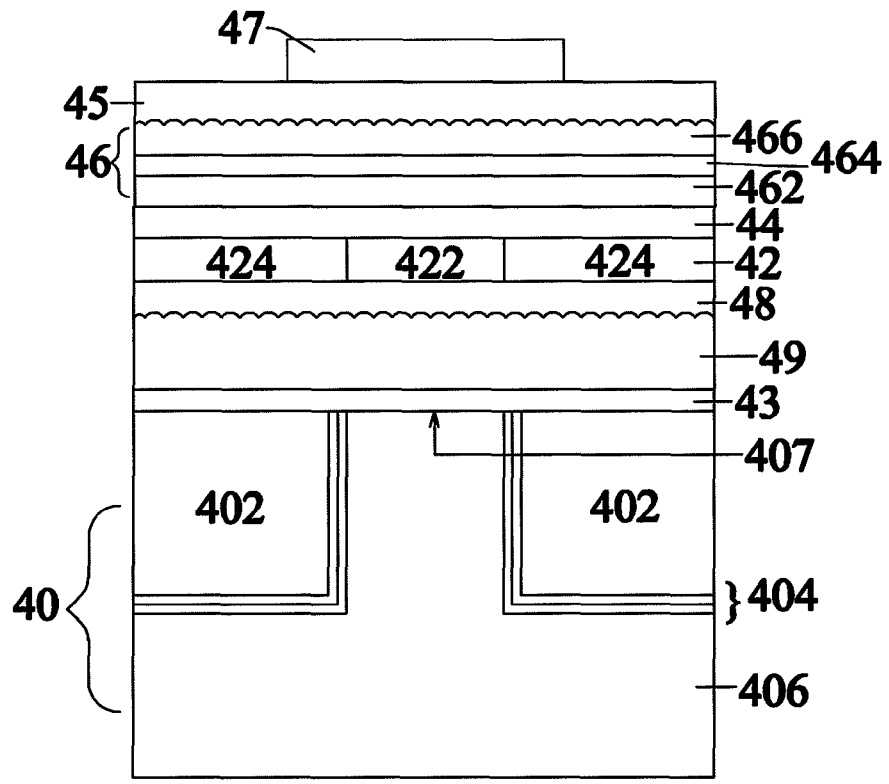
FIG. 4 illustrates a cross-sectional view of the photoelectronic element in accordance with a fifth embodiment of present application.

Refer to FIG. 4, a fifth embodiment is similar to the fourth embodiment and includes a composite substrate 40 including an electrically insulative substrate 402, an intermediate layer 404, and an electrically conductive substrate 406; a bonding layer 42 including an electrically conductive region 422, and an electrically insulative region 424; a first current spreading layer 44; a first semiconductor stacked layer 46 including a first semiconductor layer 462, a first active layer 464, and a second semiconductor layer 466; a second current spreading layer 45; and a first electrode 47. The difference is that the fifth embodiment does not have the high bad gap region and further includes a second reflective layer 43 disposed between the composite substrate 40 and the bonding layer 42; a second semiconductor stacked layer 49 including a second active layer (not shown) disposed between the second reflective layer 43 and the bonding layer 42, and a third current spreading layer 48 disposing between the second semiconductor stacked layer 49 and the bonding layer 42. The electrically conductive substrate 406 includes a contact surface 407 directly in contact with the second reflective layer 43, wherein the patterned structure of the contact surface 407, the electrically conductive region 422, and the first electrode 47 can have the same or different patterns.

The material of the second reflective layer 43 has high reflective index and can be Cu, Al, In, Sn, Au, Pt, Zn, Ag, Ti, Pb, Pd, Ge, Ni, Cr, Cd, Mn, Sb, Bi, Ga, Tl, As, Se, Te, Po, Ir, Be, Mg, Ca, Sr, Ba, Zr, Mo, La, Cu—Sn, Cu—Zn, Cu—Cd, Sn—Pb—Sb, Sn—Pb—Zn, Ni—Sn, Ni—Co, or Au Alloy and so on to reflect light from outside or the first active layer 464. The second semiconductor stacked layer 49 can produce or absorb light, and optionally has a rough top surface. The material of the second semiconductor stacked layer 49 contains one or more than one elements like Ga, Al, In, As, P, N, Zn, cd, Se, Sb, Cd, Te, Hg, S, H, Mg, Sn, B, Pb, C, and Si. The material of the third current spreading layer 48 has low lateral resistance to make the current be spread more easily in lateral direction, wherein the materials thereof can be ITO, InO, SnO, CTO, ATO, AZO, ZTO, ZnO, AlGaAs, GaN, GaP), GaAs, GaAsP, In, Sn, Al, Au, Pt, Zn, Ag, Ti, Pb, Pd, Ge, Cu, Ni, InAg, InAu, AuBe, AuGe, AuZn, PbSn, PdIn, or AuSn, and the structure thereof can be a single layer or stacked layers structure. The first semiconductor stacked layer 46 and the second semiconductor stacked layer 49 can also absorb light, so the structures thereof can be applied to light sensor or solar cell battery.

Figure 5A:
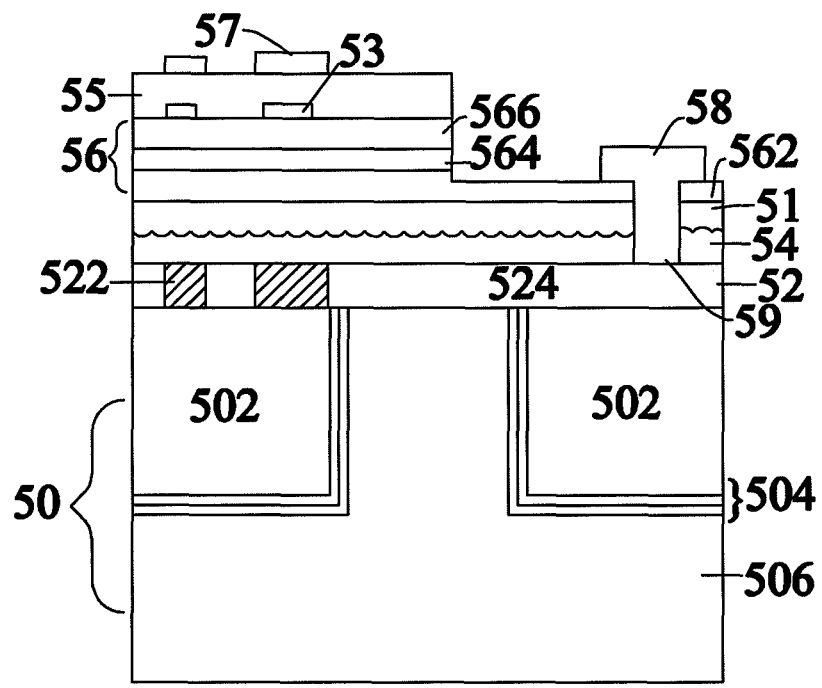
FIG. 5A illustrates a cross-sectional view of the photoelectronic element in accordance with a sixth embodiment of present application.
Figure 5B:
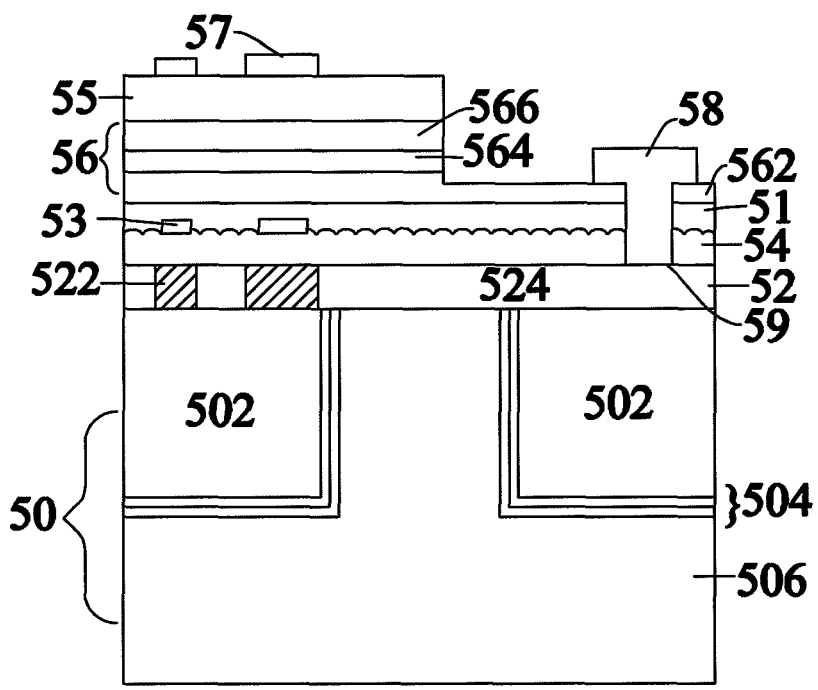
FIG. 5B illustrates a cross-sectional view of the photoelectronic element in accordance with a seventh embodiment of present application.
Figure 5C:
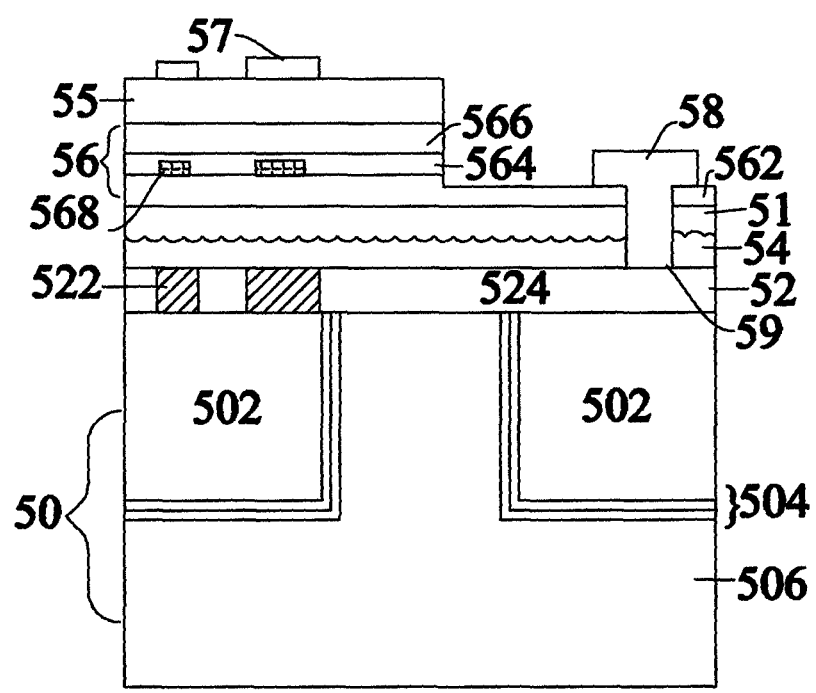
FIG. 5C illustrates a cross-sectional view of the photoelectronic element in accordance with an eighth embodiment of present application.

As shown in FIG. 5, a sixth embodiment is similar to the second embodiment and includes a composite substrate 50 including an electrically insulative substrate 502, an intermediate layer 504, and an electrically conductive substrate 506; an bonding layer 52 including an electrically conductive region 522, and an electrically insulative region 524; a first current spreading layer 54; a window layer 51, a first semiconductor stacked layer 56 including a first semiconductor layer 562, a first active layer 564, and a second semiconductor layer 566; a second current spreading layer 55; and a first electrode 57. The differences between the sixth embodiment and other embodiments is that the sixth embodiment further includes a second electrode 58 disposed on the first semiconductor layer 562 and connected to the first current spreading layer 54 via a hole 59 thereunder, and the electrically conductive region 522 is not electrically connected to the substrate 506. The first electrode 57 and the second electrode 58 are both disposed on the same side of the composite substrate 50, so a horizontal type photoelectronic element is formed accordingly. Besides, the patterned structure of the electrically conductive region 522, the current blocking layer 53, and the first electrode 57 can have the same or different patterns. As shown in FIG. 5B, a seventh embodiment is similar to the sixth embodiment, and the difference is that the current blocking layer 53 is disposed between the first current spreading layer 54 and the window layer 51 and further covered by the window layer 51. As shown in FIG. 5C, an eighth embodiment is similar to the sixth embodiment, and the difference is that the photoelectronic element dose not have the current blocking layer 53, and the first active layer 564 further includes a high band gap region 568 below or directly under the first electrode 57. The patterned structure of the electrically conductive region 522, the high band gap region 568, and the first electrode 57 can have the same or different patterns. Each foregoing pattern structure can be a continuous pattern, such as a circle with at least a protruded section.

Figure 6:
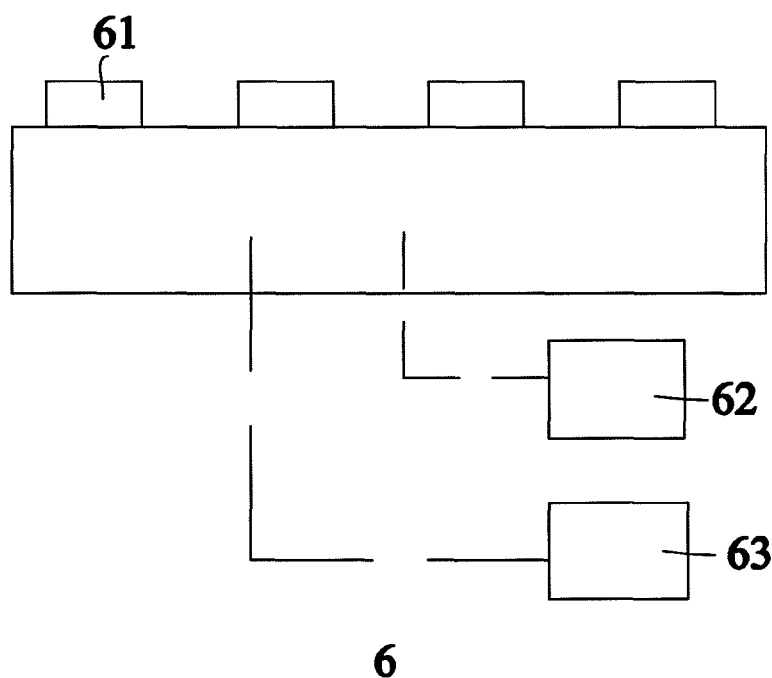
FIG. 6 illustrates a schematic diagram of a light-generating device adapting a photoelectronic element as any one of the embodiments of present application.

FIG. 6 illustrates a schematic diagram of a light-generating device. A light-generating device 6 includes a chip diced from a wafer of the photoelectronic structure of any one of the embodiments of the present application. The light-generating device 6 can be an illuminating device, such as a street light, a lamp of vehicle, or an illustrating source for interior. The light-generating device 6 can be also a traffic sign, or a backlight of a backlight module of an LCD. The light-generating device 6 includes a light source 61 composed by forgoing photoelectronic elements; a power supplying system 62 for applying current to the light source 61; and a control element 63 for controlling the power supplying system 62.

Figure 7:
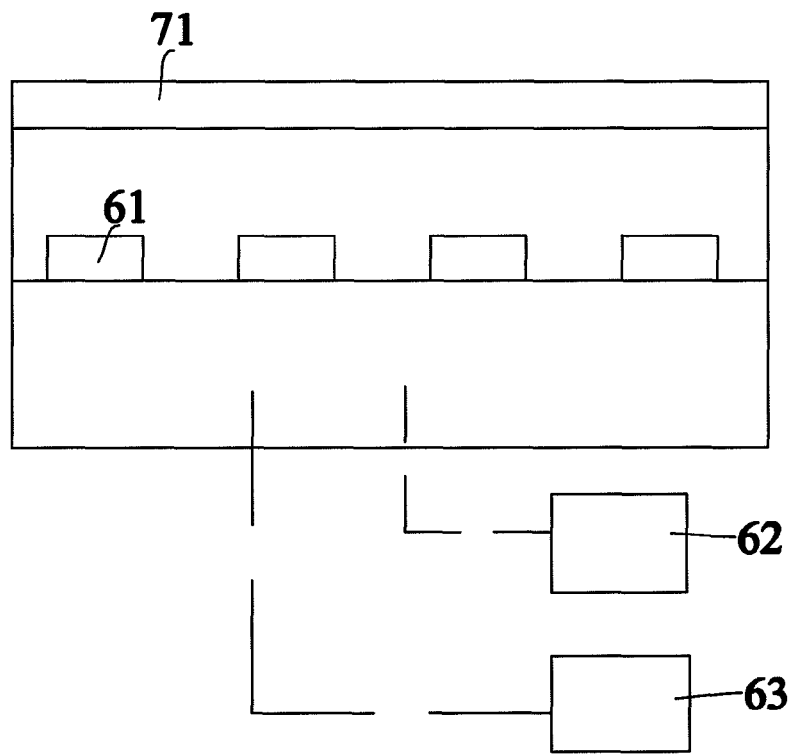
FIG. 7 illustrates a schematic diagram of a backlight module adapting a photoelectronic element as any one of the embodiments of present application.

FIG. 7 illustrates a cross-sectional schematic diagram of a back light device. A back light module 7 includes the light-generating device 6 of the forgoing embodiments and an optical element 71. The optical element 71 can process the light generated by the light-generating device 6 when applying to an LCD, such as scattering the light emitted from the light-generating device 6.

Although the present application has been explained above, it is not the limitation of the range, the sequence in practice, the material in practice, or the method in practice. Any modification or decoration for present application is not detached from the spirit and the range of such.

What is claimed is:
1. A photoelectronic element, comprising:
   an electrically insulative substrate having a top surface;
   an electrically conductive substrate having a lower portion, and an upper portion surrounded by the electrically insulative substrate and coplanar with the top surface;
   an intermediate layer having a first portion formed directly under the electrically insulative substrate and above the electrically conductive substrate, a second portion and a bent portion formed between the first portion and the second portion; and
   a semiconductor stacked layer disposed on the electrically insulative substrate and the upper portion;
   wherein the semiconductor stacked layer comprises a light emitting layer with a high band gap.
2. The photoelectronic element of claim 1, wherein the second portion surrounds the upper portion.
3. The photoelectronic element of claim 1, wherein the electrically insulative substrate is arranged to cover a part of the lower portion and expose the upper portion.
4. The photoelectronic element of claim 1, wherein the intermediate layer has an upper maximum width and a lower maximum width greater than the upper maximum width.
5. The photoelectronic element of claim 1, wherein the upper portion has a thickness substantially equal to that of the electrically insulative substrate.
6. The photoelectronic element of claim 1, wherein the electrically insulative substrate comprises an opening substantially occupied by the upper portion.
7. The photoelectronic element of claim 1, wherein the second portion is arranged between the upper portion and the electrically insulative substrate.
8. The photoelectronic element of claim 1, wherein the first portion is arranged between the lower portion and the electrically insulative substrate.
9. The photoelectronic element of claim 1, wherein the intermediate layer comprises a reflective layer.

* * * * *